United States Patent
Aga et al.

(10) Patent No.: US 6,239,004 B1
(45) Date of Patent: *May 29, 2001

(54) METHOD OF FORMING OXIDE FILM ON AN SOI LAYER AND METHOD OF FABRICATING A BONDED WAFER

(75) Inventors: Hiroji Aga; Kiyoshi Mitani; Masatake Nakano, all of Gunma-ken (JP)

(73) Assignee: Shin-Etsu Handotai Co., Ltd., Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/135,976

(22) Filed: Aug. 18, 1998

(30) Foreign Application Priority Data

Aug. 29, 1997 (JP) .................................................. 9-249307

(51) Int. Cl.[7] .................................................... H01L 21/30
(52) U.S. Cl. ........................... 438/455; 438/459; 438/151
(58) Field of Search ................................... 438/455, 459, 438/151

(56) References Cited

U.S. PATENT DOCUMENTS

| | | | |
|---|---|---|---|
| 5,451,547 | * 9/1995 | Himi et al. | 437/225 |
| 5,494,849 | 2/1996 | Iyer et al. . | |
| 5,918,139 | * 6/1999 | Mitani et al. | 438/459 |
| 5,998,281 | * 12/1999 | Aga et al. | 438/459 |
| 6,004,866 | * 12/1999 | Nakano et al. | 438/459 |
| 6,010,921 | * 1/2000 | Soutome | 438/151 |
| 6,051,452 | * 4/2000 | Shigyo et al. | 438/151 |

FOREIGN PATENT DOCUMENTS

| | | |
|---|---|---|
| 0 601 950 A2 | 6/1994 | (EP) . |
| 5160074 | 6/1993 | (JP) . |
| 5211128 | 8/1993 | (JP) . |
| 9260620 | 10/1997 | (JP) . |

OTHER PUBLICATIONS

Gassel, et al. "Novel Approach to Defect Etching in Thin Film Silicon–on–Insulator," J. Electrochem. Soc., vol. 140, No. 6, Jun. 1993, pp. 1713–1716.

* cited by examiner

Primary Examiner—Matthew Smith
Assistant Examiner—V. Yevsikov
(74) Attorney, Agent, or Firm—Hogan & Hartson, LLP

(57) ABSTRACT

In a method of fabricating a bonded wafer, an oxide film is first formed on the surface of at least one of two mirror-polished silicon wafers. The two silicon wafers are superposed such that the mirror-polished surfaces come into close contact with each other, and heat treatment is performed in order to join the wafers together firmly. Subsequently, the thickness of one of the wafers is reduced so as to yield a thin film, the surface of which is then polished and subjected to vapor-phase etching in order to make the thickness of the thin film uniform. Optionally, the vapor-phase-etched surface is then mirror-polished. The surface of the bonded wafer is oxidized, and the generated surface oxide film is then removed. In the method, the thickness of the oxide film formed on the surface of the bonded wafer is made not greater than 50 nm. The method reliably eliminates damage and crystal defects generated during etching in accordance with PACE method or subsequent mirror polishing, and thereby enables relatively simple and low cost manufacture of bonded wafers having a very thin SOI layer that has good thickness uniformity and excellent crystallinity.

10 Claims, 4 Drawing Sheets

METHOD OF FORMING OXIDE FILM ON AN SOI LAYER AND METHOD OF FABRICATING A BONDED WAFER

BACKGROUND OF THE INVENTION

1. Field of the Invention

The present invention relates to a technique for forming an oxide film on a wafer having an SOI (Silicon on Insulator) structure and to a technique for fabricating a bonded wafer having an SOI structure in which two mirror-polished silicon wafers are bonded together without use of adhesive, one of the wafers subsequently being made very thin.

2. Description of the Related Art

Two methods have been widely noticed as methods for fabricating wafers having an SOI structure. One method is a SIMOX (separation by implanted oxygen) method in which oxygen ions are implanted into a silicon monocrystal at a high concentration, and heat treatment is then performed at a high temperature in order to form an oxide film. The other method is a bonding method in which two mirror-polished silicon wafers are bonded together without use of adhesive, one of the wafers subsequently being made very thin.

In the SIMOX method, the thickness of an SOI layer that becomes a device active region can be determined and controlled through adjustment of an acceleration voltage at the time of oxygen ion implantation. Therefore, the SIMOX method has an advantage of enabling easy formation of a thin SOI layer having a high uniformity of thickness (hereinafter called "thickness uniformity"). However, the SIMOX method has many problems in relation to the reliability of a buried oxide film, the crystallinity of the SOI layer, and necessity of heat treatment at a temperature of 1300° C. or higher.

Meanwhile, in the wafer bonding method, an oxide film is formed on at least one of two mirror-polished silicon monocrystalline wafers, which are bonded together without use of adhesive and then subjected to heat treatment (typically, at 1100–1200° C.) in order to strengthen the bonding; subsequently, one of the wafers is subjected to grinding or wet etching such that the wafer becomes a thin film, the surface of which is then mirror-polished to form an SOI layer. Therefore, the reliability of the buried oxide film is high, and the crystallinity of the SOI layer is good. However, since the thin film is formed by means of mechanical machining, there are limits in relation to the thickness and the thickness uniformity of the resultant SOI layer.

However, a further reduction of the thickness of an SOI layer has been demanded in order to cope with an increased degree of integration and an increased speed of semiconductor devices, and there has arisen demand for a very thin SOI layer having a thickness of 1 $\mu$m or less. Therefore, in order to enable such a very thin SOI layer to be fabricated through use of a bonded wafer and to decrease the thickness of the SOI layer to a level equal to or less than that obtained according to the SIMOX method, thereby enabling the bonded wafer to be used as a future CMOS substrate, the SOI layer must be machined to a thickness and accuracy of 0.1 $\mu$m±0.01 $\mu$m at least.

In order to realize a thickness and accuracy of 0.1 $\mu$m±0.01 $\mu$m in a bonded wafer, a so-called PACE (plasma assisted chemical etching) method has been developed, and is disclosed in Japanese Patent Application Laid-Open (kokai) No. 5-160074. In the PACE method, the thickness of a thin film is made uniform through vapor-phase etching. The distribution of thickness of a silicon layer whose thickness is to be made uniform is measured to form a map of thickness distribution; and the vapor-phase etching is numerically controlled in accordance with the map in order to locally remove thicker portions, thereby fabricating a very thin film having a very high thickness uniformity.

However, in the above-described PACE method, since the surface of a thin film is removed through use of RF plasma, slight damage is generated at the surface of an SOI layer. Also, when an SOI layer is treated under the PACE method, periodic fine roughness having a period of 0.01–5 $\mu$m, so-called haze, may be newly generated on the surface of the SOI layer. Therefore, in order to eliminate the haze, polishing for removing a very small amount of stock, called touch polishing, must be performed after completion of the process according to the PACE method. However, when an SOI layer that had undergone touch polishing was evaluated in accordance with a four-step Secco-etching disclosed by H. Gassel et al. (J. Electrochem. Soc., 140, pp 1713, 1993), it was found that high density crystal defects existed at the surface of the SOI layer. That is, use of touch polishing does not eliminate damage and crystal defects generated during the process according to the PACE method, or the touch polishing itself generates damage and crystal defects. These residual damage and crystal defects adversely affect the electrical characteristics of devices.

In order to remove damage and crystal defects generated during the process according to the PACE method, the applicant of the present application has proposed a method disclosed in Japanese Patent Application No. 8-94855, in which an SOI layer is subjected to thermal oxidation after touch polishing in order to form an oxide film, which is then removed by an amount corresponding to the thickness of damage and crystal defects. However, a satisfactory result has not been obtained, and therefore a further decrease in damage and crystal defects has been demanded.

The reason for failure to obtain a satisfactory result has been investigated through use of four-step Secco-etching. From the evaluation through use of four-step Secco-etching, it was found that when an SOI wafer is subjected to a thermal oxidation process after touch polishing, crystal defects may be newly introduced due to thermal oxidation, depending on the conditions therefor.

SUMMARY OF THE INVENTION

The present invention has been accomplished to solve the above-mentioned problems, and an object of the invention is to provide a method for forming an oxide film on an SOI layer, which establishes conditions for thermal oxidation that do not newly generate crystal defects during a thermal oxidation process after vapor-phase etching and/or touch polishing, which reliably eliminates crystal defects and latent damage generated during the vapor-phase etching or touch polishing, and which thereby enables relatively simple and low cost manufacture of bonded wafers having a very thin SOI layer that has good thickness uniformity and excellent crystallinity.

To achieve the above object, the present invention provides a method of forming an oxide film on an SOI layer, wherein the thickness of the oxide film is not greater than 50 nm.

In the method, since the thickness of the oxide film formed through thermal oxidation is restricted to not greater than 50 nm, stress acting on the SOI film sandwiched between a buried oxide layer and the surface oxide film decreases, so that defects are not newly introduced. Further, such thermal oxidation process enables removal of defects and latent damage existing at the surface of the SOI layer. If the thickness of the oxide film formed through thermal oxidation exceeds 50 nm, stress acts on the thin SOI layer, resulting in introduction of new crystal defects.

The present invention also provides a method of fabricating a bonded wafer which comprises the steps of forming an oxide film on the surface of at least one of two mirror-polished silicon wafers; superposing the two silicon wafers such that the mirror-polished surfaces come into close contact with each other; heat-treating the wafers in order to join the wafers together firmly; reducing the thickness of one of the wafers so as to yield a thin film; polishing the surface of the thin film; performing vapor-phase etching in order to make the thickness of the thin film uniform; optionally mirror-polishing the vapor-phase-etched surface; oxidizing the surface of the bonded wafer; and removing the generated surface oxide film, wherein the thickness of the oxide film formed on the surface of the bonded wafer is made not greater than 50 nm.

As described above, in the method of fabricating a bonded wafer according to the present invention, after the surface of the SOI layer is processed by means of vapor-phase etching or after the vapor-phase-etched surface is mirror-polished, the surface of the bonded wafer is oxidized, and the generated surface oxide film is removed. Therefore, the surface of the layer on which damage and/or crystal defects have been generated during the vapor-phase etching or the subsequent mirror polishing (hereinafter may be referred to as a "damage layer") is converted into an oxide film, which is then removed, whereby the damage and/or crystal defects at the surface of the SOI layer can be eliminated.

In the present invention, when the surface of the SOI layer of the bonded wafer is subjected to thermal oxidation, the thickness of the oxide film must be controlled to be not greater than 50 nm. It was found that if the thickness of the oxide film exceeds 50 nm, an extremely large number of new crystal defects are generated.

Preferably, in method of fabricating a bonded wafer according to the present invention, the thickness of the SOI layer after the thickness of the thin film is made uniform through vapor-phase etching or after the vapor-phase-etched surface is mirror-polished is 1 µm or less.

As described above, the present invention is effective in preventing generation of crystal defects and the like in a very thin SOI layer having a thickness of 1 µm or less, which has been recently demanded. That is, when an oxide film is formed on such a very thin SOI layer, a large stress acts on the SOI layer, so that crystal defects and the like are easily generated in the SOI layer. The present invention can prevent generation of such defects and the like.

The method of the present invention enables fabrication of a silicon bonded wafer, in which residual damage and crystal defects generated during the vapor-phase etching or the subsequent polishing have been reliably removed, and which therefore has a high degree of thickness uniformity.

As described above, in the present invention, when the surface of the SOI layer is oxidized, the thickness of the oxide film is made not greater than 50 nm. Therefore, oxidation process can be carried out without introduction of new crystal defects into the SOI layer. Accordingly, it becomes possible to eliminate, without generating of new crystal defects, residual damage and crystal defects of a bonded wafer in which the thickness of the thin film has been made uniform through vapor-phase etching and the etched surface has been polished through touch polishing. Thus, a bonded wafer having an excellent crystallinity can be fabricated relatively easily and at relatively low cost.

BRIEF DESCRIPTION OF THE DRAWING

FIGS. 2A and 2B are views schematically showing a vapor-phase etching according to the PACE method, wherein FIG. 2A is a perspective view and FIG. 2B is a sectional view;

DESCRIPTION OF THE PREFERRED EMBODIMENT

An embodiment of the present invention will next be described with reference to the drawings. However, the present invention is not limited thereto.

Figure 1:
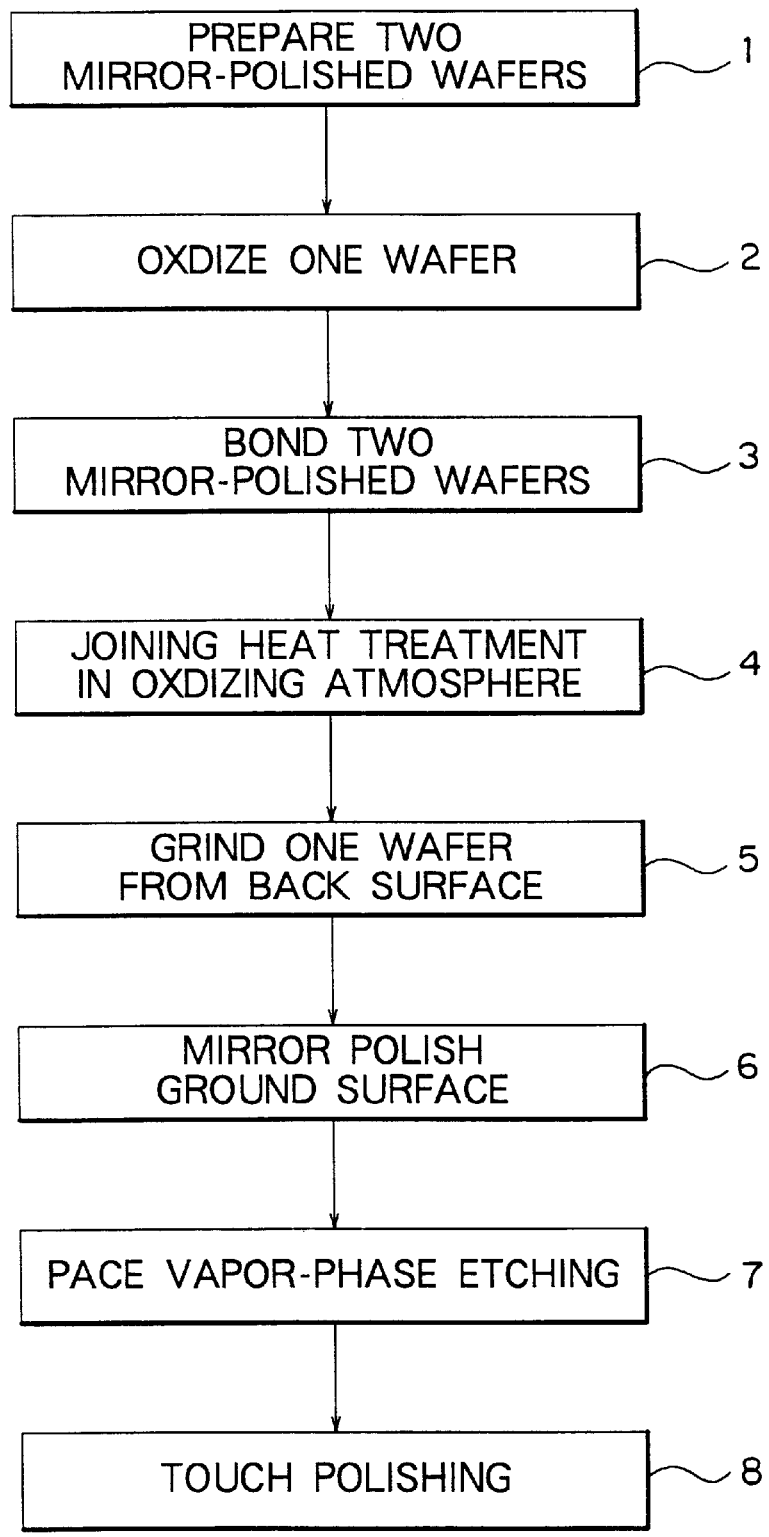
FIG. 1 is a flowchart showing an example of a process for fabricating a bonded wafer.

FIG. 1 is a process chart showing a process for fabricating a bonded wafer including a vapor-phase etching step and a touch polishing step. In step 1, there are prepared two mirror-polished silicon wafers suitable for specifications of devices. In step 2, at least one of the wafers is subjected to thermal oxidation to form on the surface thereof an oxide film of about 0.3–2.0 µm in thickness. In step 3, the two silicon wafers are superposed such that the mirror-polished surfaces come into close contact with each other. When the mirror-polished surfaces of the wafers are brought into contact with each other at room temperature in a clean atmosphere, the wafers are joined to each other without use of adhesive or the like. The bonding strength of the joined wafers is so low that they cannot be used as they are in a device fabricating process. Therefore, in step 4, the wafers must be subjected to heat treatment in an oxidizing atmosphere in order to increase the bonding strength to a sufficient level. This heat treatment is preferably performed in a wet oxygen atmosphere at 1050–1200° C. for 30 minutes to 2 hours. In subsequent step 5, one surface of the bonded wafer is ground. The wafer to be ground may be a wafer on which an oxide film has been formed in step 2 or a wafer on which no oxide film has been formed. One of the wafers is ground from the back surface (from the top surface of the bonded wafer) such that the thickness of an SOI layer becomes about 10 µm. In step 6, the surface ground in step 5 is mirror polished. In this step, mirror polishing is performed in the same manner as in an ordinary process for fabricating a mirror-polished wafer. Thus, the thickness of the SOI layer is decreased to about 2–7 µm.

Figure 2A:
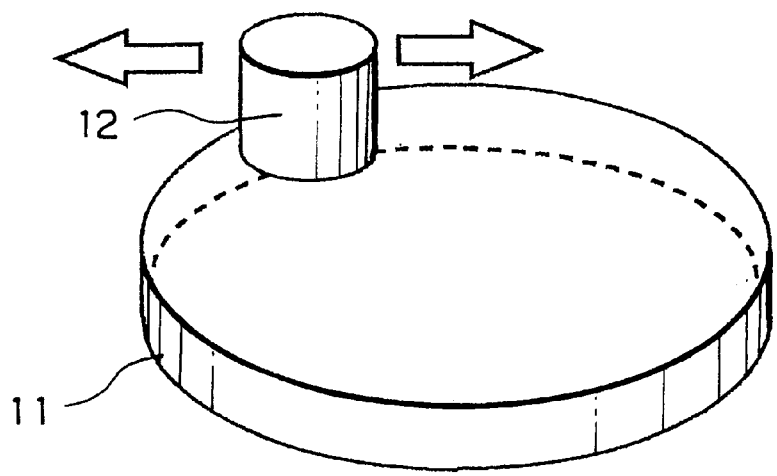
Figure 2B:
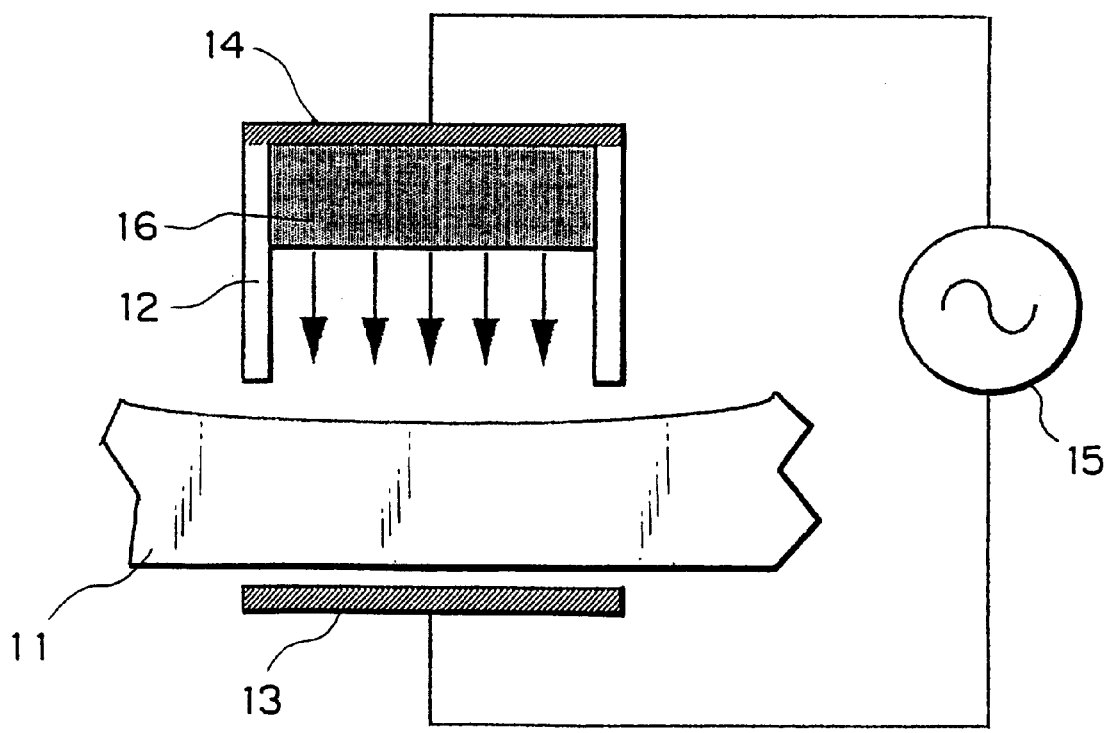

In next step 7, the thickness of the thin film is made uniform through vapor-phase etching. In this step is preferably used the PACE method, in which, as shown in FIGS. 2A and 2B, RF plasma 16 is locally generated within a cavity 12 in order to perform vapor-phase etching.

The PACE method is one type of dry etching. The distribution of thickness of an SOI layer on a bonded wafer 11 is first measured. When the cavity 12 is moved over the bonded wafer 11, the traveling speed of the cavity 12 is controlled according to the thickness distribution, so that the time period during which each portion is exposed to the plasma 16 is controlled. As a result, the etching removal amount at the surface is controlled, and thus the thickness of the SOI layer on the bonded wafer 11 is made uniform. The plasma 16 is locally generated within the cavity 12 through application of an RF voltage from an RF power source 15 to electrodes 13 and 14 disposed above and below the bonded wafer 11. The cavity 12 is supported such that it can freely move over the bonded wafer 11.

Step 8 is for touch polishing intended to eliminate haze at the surface generated due to the vapor-phase etching in step 7. The vapor-phase-etched surface is polished to a depth of 5–15 nm, preferably about 10 nm.

Figure 3:
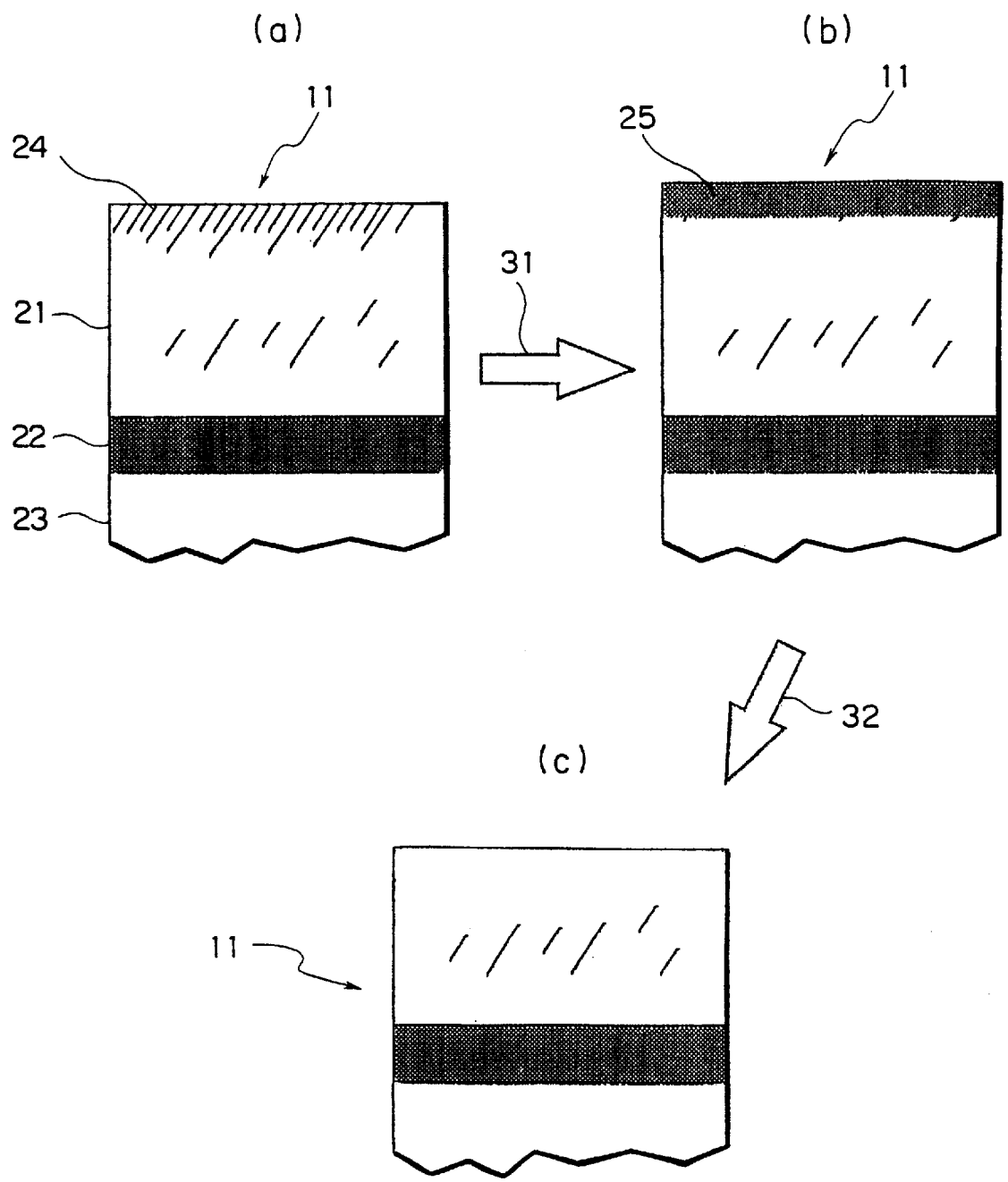
FIG. 3 is an explanatory view showing changes of damage and crystal defects in a process for eliminating damage and crystal defects existing at the surface of a bonded wafer according to the present invention.

Although a bonded wafer is fabricated through the above-described steps, the SOI layer of the thus-fabricated bonded wafer has much damage and many crystal defects, especially in the vicinity of the surface, as shown in Section (a) of FIG. 3.

In the present invention, the layer of damage and crystal defects 24 is removed by means of subsequent oxidation, and there is a possibility that new damage is generated in the touch polishing step. Therefore, step 8 may be omitted.

FIG. 3 is an explanatory view showing changes in the density of damage and crystal defects in a process for eliminating damage and crystal defects existing at the surface of a bonded wafer according to the present invention. Section (a) of FIG. 3 shows a wafer immediately after undergoing the steps of FIG. 1. An oxide film 22 is buried between a base wafer 23 serving as a support and an SOI layer 21. As compared with the bulk portion, the vicinity of the surface of the SOI layer 21 contains more damage and a larger number of crystal defects 24. The layer of damage and crystal defects reaches a depth of about 300 nm.

In the present invention, in order to remove the layer of damage and crystal defects, the surface of the thus-fabricated bonded wafer 11 is first oxidized in an oxidation step 31 in order to form an oxide film 25 including a part of a region where damage and crystal defects 24 exist, as shown in Section (b) of FIG. 3. Subsequently, in an oxide film removal step 32, the oxide film 25 is removed, so that the layer of damage and crystal defects 24 is removed, as shown in Section (c) of FIG. 3. The removal of the oxide film 25 is performed such that the SOI layer has a desired target thickness after the oxide film removal step 32.

In the oxidation step 31 of the present invention, the thickness of the oxide film is made less than 50 nm. As described in the "Description of Related Art" section, in the technique proposed in Japanese Patent Application No. 8-94855, the entire damage layer 24 must be converted into an oxide film.

The inventors of the present invention investigated in detail and found that the layer of damage and crystal defects 24 can be eliminated through a simple process of heat treating the wafer in an atmosphere of an inert gas such as argon, nitrogen or a reduction gas such as hydrogen.

However, if heat treatment is performed under proper conditions in order to eliminate the layer of damage and crystal defects 24, there occurs a phenomenon that the silicon surface is slightly etched and roughed.

Therefore, heat treatment must be performed in an oxidizing atmosphere containing at least oxygen gas and water vapor in order to carry out the heat treatment while protecting the surface with a formed oxide film. However, through an experiment, which will be described below, it was found that if the thickness of the oxide film formed on the SOI layer exceeds 50 nm, an extremely large number of new crystal defects are induced into the SOI layer. In the experiment, the SOI layer (0.8 $\mu$m thick) of a 6-inch bonded wafer which had undergone vapor-phase etching and subsequent touch polishing was subjected to thermal oxidation such that an oxide film having a certain thickness was formed. A plurality of samples were fabricated while the thickness of the oxide film was changed. After removal of the oxide film, these samples were etched in accordance with the four-step Secco-etching method in order to obtain the relationship between pit density and thickness of the oxide film (white circles in FIG. 4). Also, pit density was measured immediately after the vapor-phase etching according to the PACE method but before the touch polishing and the oxidation (white triangles in FIG. 4).

Figure 4:
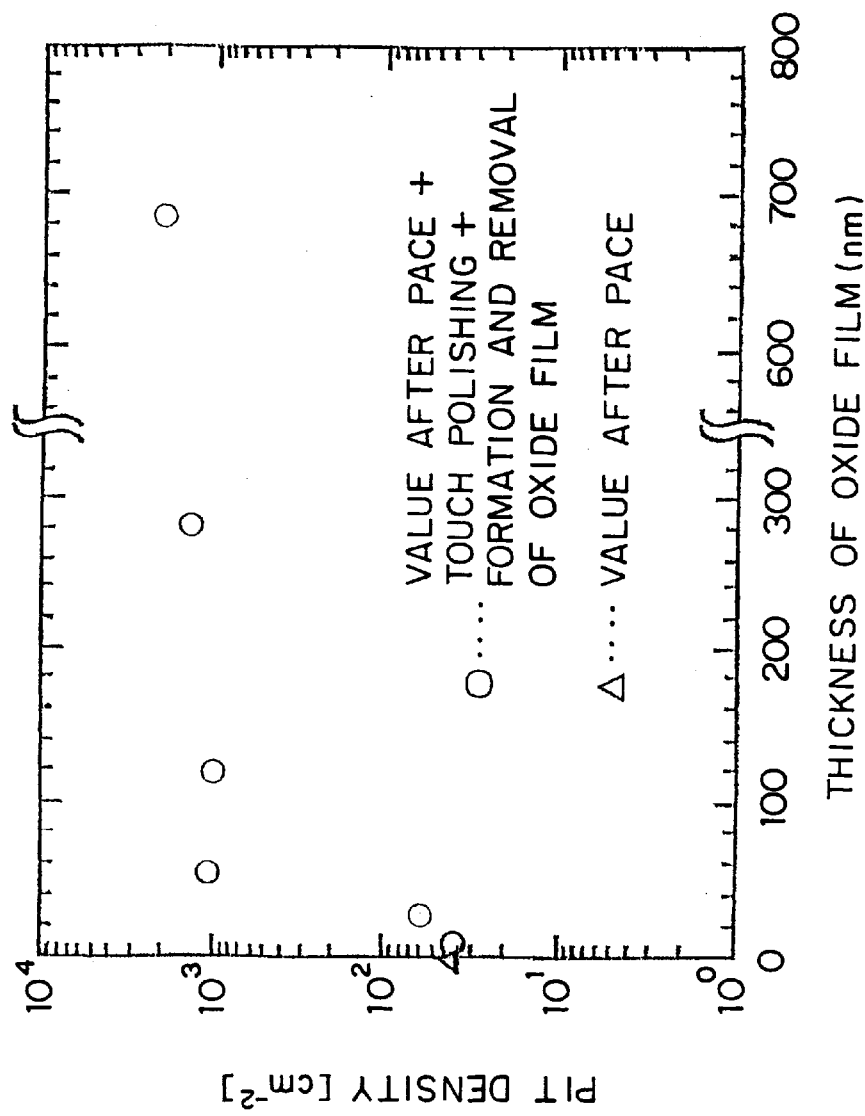
FIG. 4 is a graph showing the relationship between the thickness of the thermal oxide film and the density of surface defect pits in the present invention.

As is apparent from FIG. 4, when the thickness of the oxide film is less than 50 nm, the pit density is $2\times10^1$–$8\times10^1$ counts/cm$^2$, which is an excellent value. However, when the thickness of the oxide film exceeds 50 nm, the pit density increases to the order of $10^3$ counts/cm$^2$, which is considerably high.

Although the mechanism of generation of such crystal defects is not clear, it is assumed that generation of crystal defects is caused by, for example, discharge of interstitial silicon into a thin SOI layer due to oxidation, and introduction of stress into the thin SOI layer due to a sandwich structure formed by the oxide film.

Formation of an oxide film on the SOI film is preferably performed at 800–1150° C. for about 30–180 minutes in an oxidizing atmosphere obtained through addition of a few to a few tens of percent of oxygen gas into nitrogen gas. However, an oxidizing atmosphere that contains neither inert gas nor reduction gas may be used insofar as the thickness of the oxide film can be controlled to be less than 50 nm. Further, the oxide film is preferably removed through wet etching, particularly preferably etching by use of aqueous solution of hydrofluoric acid.

There may be anxiety that if the thickness of the oxide film is set to a thickness less than 50 nm, crystal defects extending to a depth of 300 nm from the surface of the SOI layer cannot be eliminated. However, as is demonstrated by the results of the above-described experiment, the pit density of the surface decreases considerably when the thickness of the oxide film is set to a thickness less than 50 nm. This means that crystal defects and the like at the surface of the SOI layer are eliminated by the oxidizing heat treatment.

The method of forming an oxide film has been described as a measure for eliminating damage and crystal defects existing at the surface of the SOI layer of a bonded wafer of the present invention. However, the method can be applied to any wafer having an SOI layer, regardless of the manner of formation of the SOI layer, such as a wafer bonding method or an SIMOX method. Further, the method can be applied to an SOI layer that has undergone PACE or PACE+ touch polishing for eliminating damage and crystal defects at the surface of the SOI layer formed by the above-described SOI layer forming methods. Further, the method can be applied to the case where the conditions of the surface of an ordinary SOI wafer are improved through use of heat treatment, and the case where the surface of the SOI wafer is merely oxidized.

The SIMOX method is an SOI layer forming method whose basic concept is that high concentration ions ($^{16}O^+$) are implanted into a monocrystalline silicon substrate, and reaction between Si and O is caused through a high temperature heat treatment (1100–1300° C.) in order to form a B—SiO$_2$ film (buried oxide film) inside the silicon substrate.

EXAMPLE

Next, the present invention will be described by way of example. However, the present invention is not limited thereto.

Twenty-four mirror-polished silicon wafers having a diameter of 150 mm (conductive type: p type; resistivity: 10 Ω·cm) were prepared and divided into 12 bond wafers and 12 base wafers. These wafers were joined in accordance with the processes shown in FIG. 1 in order to yield 12 bonded wafers whose SOI layer had a thickness of 0.8 µm. The 12 bonded wafers were subjected to thermal oxidation two pieces at a time such that the thickness of the oxide film became 6 nm, 24 nm, 50 nm, 110 nm, 275 nm, or 685 nm (six kinds). For the oxide film thicknesses of 6 nm, 24 nm, and 50 nm, an oxidation atmosphere containing 95% nitrogen and 5% oxygen was used. For the oxide film thicknesses of 110 nm, 275 nm, and 685 nm, a wet oxygen atmosphere was used. Subsequently, the oxide film was removed through use of aqueous solution of hydrofluoric acid, and then preferential etching was performed in accordance with the above-described four-step Secco-etching in order to measure the density of defect pits at the surface of the SOI layer. The results of the measurement are shown in FIG. 4. In FIG. 4, the horizontal axis represents thickness of the oxide film, and the vertical axis represents density of defect pits. For comparison, there is shown in FIG. 4 the results of evaluation of defect pit density of two comparative wafers, performed in accordance with the four-step Secco-etching method. The comparative wafers had undergone vapor-phase etching in accordance with the PACE method, but had not undergone touch polishing and oxidation. In FIG. 4, there is shown the average value of two wafers having the same oxide film thickness. As is apparent from FIG. 4, when the oxide film thickness is equal to or greater than 50 nm, the defect pit density is high, and when the oxide film thickness becomes less than 50 nm, the defect pit density decreases drastically.

The present invention is not limited to the above-described embodiment. The above-described embodiment is a mere example, and those having the substantially same structure as that described in the appended claims and providing the similar action and effects are included in the scope of the present invention.

For example, in the above-described embodiment, the thickness of one of the wafers constituting a bonded wafer is decreased by means of grinding, polishing, and vapor-phase etching. However, the technique disclosed in Japanese Patent Application Laid-Open (kokai) No. 5-211128 may alternatively be used. In the technique, hydrogen ions (protons) or noble gas ions are implanted into the upper surface of one of silicon wafers before being joined in order to form a fine bubble layer within the wafer; the wafer is joined to the other silicon wafer via an oxide film; and then heat treatment is performed to separate a part of the wafer to form a thin film, while the fine bubble layer is used as a delaminating plane, to thereby obtain an SOI wafer.

What is claimed is:

1. A method of fabricating a bonded wafer, comprising the steps of:

forming an oxide film on the surface of at least one of two mirror-polished silicon wafers;

superposing the two silicon wafers such that the mirror-polished surfaces come into close contact with each other;

heat-treating the wafers in order to join the wafers together firmly;

reducing the thickness of one of the wafers so as to yield a thin film;

polishing the surface of the thin film;

performing vapor-phase etching in order to make the thickness of the thin film uniform;

subjecting the surface of the bonded wafer to thermal oxidation to form an oxide film on the surface; and removing the oxide film formed on the surface of the bonded wafer, wherein the thickness of the oxide film formed on the surface of the bonded wafer is made not greater than 50 nm.

2. A method of fabricating a bonded wafer according to claim 1, wherein the thickness of the SOI layer after the thickness of the thin film is made uniform through vapor-phase etching is 1 µm or less.

3. A method of fabricating a bonded wafer according to claim 1, wherein the step of subjecting the surface of the bonded wafer to thermal oxidation to form an oxide film on the surface is performed at 800°–1150° C. for 30–180 minutes in an atmosphere of oxygen gas in nitrogen gas.

4. A method of fabricating a bonded wafer according to claim 1, wherein the step of removing the oxide film formed on the surface of the bonded wafer is carried out by wet etching.

5. A method of fabricating a bonded wafer according to claim 4, wherein the wet etching is carried out by use of an aqueous solution of hydrofluoric acid.

6. A method of fabricating a bonded wafer, comprising the steps of:

forming an oxide film on the surface of at least one of two mirror-polished silicon wafers;

superposing the two silicon wafers such that the mirror-polished surfaces come into close contact with each other;

heat-treating the wafers in order to join the wafers together firmly;

reducing the thickness of one of the wafers so as to yield a thin film;

polishing the surface of the thin film;

performing vapor-phase etching in order to make the thickness of the thin film uniform;

mirror-polishing the vapor-phase-etched surface;

subjecting the surface of the bonded wafer to thermal oxidation to form an oxide film on the surface; and removing the oxide film formed on the surface of the bonded wafer, wherein the thickness of the oxide film formed on the surface of the bonded wafer is made not greater than 50 nm.

7. A method of fabricating a bonded wafer according to claim 6, wherein the thickness of the SOI layer after the thickness of the thin film is made uniform through vapor-phase etching or after the vapor-phase-etched surface is mirror-polished is 1 µm or less.

8. A method of fabricating a bonded wafer according to claim 6, wherein the step of subjecting the surface of the bonded wafer to thermal oxidation to form an oxide film on the surface is performed at 800°–1150° C. for 30–180 minutes in an atmosphere of oxygen gas in nitrogen gas.

9. A method of fabricating a bonded wafer according to claim 6, wherein the step of removing the oxide film formed on the surface of the bonded wafer is carried out by wet etching.

10. A method of fabricating a bonded wafer according to claim 9, wherein the wet etching is carried out by use of an aqueous solution of hydrofluoric acid.

* * * * *